(12) United States Patent
Huber et al.

(10) Patent No.: US 9,166,579 B2
(45) Date of Patent: Oct. 20, 2015

(54) METHODS AND APPARATUSES FOR SHIFTING DATA SIGNALS TO MATCH COMMAND SIGNAL DELAY

(75) Inventors: Brian Huber, Allen, TX (US); Parthasarathy Gajapathy, Highland Village, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/486,674

(22) Filed: Jun. 1, 2012

(65) Prior Publication Data

US 2013/0321052 A1    Dec. 5, 2013

(51) Int. Cl.
| | |
|---|---|
| H03H 11/26 | (2006.01) |
| H03K 5/135 | (2006.01) |
| G11C 7/04 | (2006.01) |
| G11C 7/10 | (2006.01) |
| G11C 7/22 | (2006.01) |
| G11C 19/00 | (2006.01) |

(52) U.S. Cl.
CPC ........ *H03K 5/135* (2013.01); *G11C 7/04* (2013.01); *G11C 7/1087* (2013.01); *G11C 7/1093* (2013.01); *G11C 7/222* (2013.01); *G11C 19/00* (2013.01); *G11C 2207/2272* (2013.01)

(58) Field of Classification Search
USPC .......................................................... 327/261
See application file for complete search history.

(56) References Cited

U.S. PATENT DOCUMENTS

| | | | | |
|---|---|---|---|---|
| 5,004,933 A | * | 4/1991 | Widener ........................ | 327/141 |
| 6,111,810 A | | 8/2000 | Fujita | |
| 6,219,384 B1 | | 4/2001 | Kliza et al. | |
| 6,260,128 B1 | | 7/2001 | Ohshima et al. | |
| 6,275,077 B1 | * | 8/2001 | Tobin et al. .................... | 327/108 |
| 6,424,592 B1 | | 7/2002 | Maruyama | |
| 6,438,055 B1 | | 8/2002 | Taguchi et al. | |
| 6,459,313 B1 | * | 10/2002 | Godbee et al. ................ | 327/161 |
| 6,489,823 B2 | | 12/2002 | Iwamoto | |
| 6,510,095 B1 | | 1/2003 | Matsuzaki et al. | |
| 6,636,110 B1 | | 10/2003 | Ooishi et al. | |
| 6,687,185 B1 | | 2/2004 | Keeth et al. | |
| 6,710,726 B2 | * | 3/2004 | Kim et al. ..................... | 341/100 |
| 6,744,285 B2 | | 6/2004 | Mangum et al. | |
| 6,781,861 B2 | | 8/2004 | Gomm et al. | |
| 6,839,288 B1 | | 1/2005 | Kim et al. | |
| 6,861,901 B2 | * | 3/2005 | Prexl et al. .................... | 329/347 |
| 6,914,798 B2 | | 7/2005 | Kwon et al. | |

(Continued)

OTHER PUBLICATIONS

Related U.S. Appl. No. 13/364,198, filed Feb. 1, 2012.
Related U.S. Appl. No. 13/531,341, filed Jun. 22, 2012.
Related U.S. Appl. No. 13/543,698, filed Jul. 6, 2012.
Related U.S. Appl. No. 13/592,244, filed Aug. 22, 2012.
Notificiation of International Search Report and Written Opinion dated May 7, 2012 for International Application No. PCT/US2012/027672, May 7, 2012, 1-9.

(Continued)

*Primary Examiner* — Thomas J Hiltunen
(74) *Attorney, Agent, or Firm* — Dorsey & Whitney LLP (57) ABSTRACT

Methods and apparatuses for shifting data signals are disclosed herein. An apparatus may comprise a clock generation circuit, a delay path, and a driver. The clock generation circuit may be configured to receive an input clock signal and generate a plurality of clock signals based, at least in part, on the clock signal. A delay path may be coupled to the clock generation circuit and configured to receive the input clock signal and the plurality of clock signals. The delay path may be further configured to receive a data signal and delay the data signal based, at least in part, on the input clock signal and each of the plurality of clock signals. A driver may be coupled to the delay path and configured to receive the delayed data signal, and may further be configured to provide the delayed data signal to a bus.

21 Claims, 6 Drawing Sheets

(56) References Cited

U.S. PATENT DOCUMENTS

| | | | |
|---|---|---|---|
| 6,930,955 B2 | 8/2005 | Johnson et al. | |
| 6,973,008 B2 | 12/2005 | Krause | |
| 6,980,479 B2 | 12/2005 | Park | |
| 6,988,218 B2 | 1/2006 | Drexler | |
| 7,042,799 B2 | 5/2006 | Cho | |
| 7,046,060 B1 | 5/2006 | Minzoni et al. | |
| 7,058,799 B2 | 6/2006 | Johnson | |
| 7,061,941 B1* | 6/2006 | Zheng | 370/535 |
| 7,065,001 B2 | 6/2006 | Johnson et al. | |
| 7,111,185 B2 | 9/2006 | Gomm et al. | |
| 7,119,591 B1 | 10/2006 | Lin | |
| 7,170,819 B2 | 1/2007 | Szczypinski | |
| 7,187,599 B2 | 3/2007 | Schnell et al. | |
| 7,209,396 B2 | 4/2007 | Schnell | |
| 7,248,512 B2 | 7/2007 | Shin | |
| 7,268,605 B2* | 9/2007 | Fang et al. | 327/261 |
| 7,269,754 B2 | 9/2007 | Ramaswamy et al. | |
| 7,280,430 B2 | 10/2007 | Lee | |
| 7,336,752 B2 | 2/2008 | Vlasenko et al. | |
| 7,340,632 B2 | 3/2008 | Park | |
| 7,375,560 B2 | 5/2008 | Lee et al. | |
| 7,411,852 B2 | 8/2008 | Nishioka et al. | |
| 7,443,216 B2 | 10/2008 | Gomm et al. | |
| 7,451,338 B2 | 11/2008 | Lemos | |
| 7,463,534 B2* | 12/2008 | Ku et al. | 365/189.011 |
| 7,489,172 B2 | 2/2009 | Kim | |
| 7,509,517 B2* | 3/2009 | Matsumoto et al. | 713/600 |
| 7,590,013 B2 | 9/2009 | Yu et al. | |
| 7,593,273 B2* | 9/2009 | Chu et al. | 365/194 |
| 7,609,584 B2 | 10/2009 | Kim et al. | |
| 7,616,040 B2* | 11/2009 | Motomura | 327/202 |
| 7,631,248 B2 | 12/2009 | Zakharchenko et al. | |
| 7,643,334 B1 | 1/2010 | Lee et al. | |
| 7,656,745 B2 | 2/2010 | Kwak | |
| 7,660,187 B2 | 2/2010 | Johnson et al. | |
| 7,663,946 B2 | 2/2010 | Kim | |
| 7,671,648 B2 | 3/2010 | Kwak | |
| 7,675,439 B2* | 3/2010 | Chang et al. | 341/100 |
| 7,698,589 B2 | 4/2010 | Huang | |
| 7,715,260 B1 | 5/2010 | Kuo et al. | |
| 7,716,510 B2 | 5/2010 | Kwak | |
| 7,751,261 B2 | 7/2010 | Cho | |
| 7,773,435 B2 | 8/2010 | Cho | |
| 7,822,904 B2 | 10/2010 | LaBerge | |
| 7,826,305 B2 | 11/2010 | Fujisawa | |
| 7,826,583 B2* | 11/2010 | Jeong et al. | 375/376 |
| 7,872,924 B2 | 1/2011 | Ma | |
| 7,885,365 B2* | 2/2011 | Hagleitner et al. | 375/355 |
| 7,913,103 B2 | 3/2011 | Gold et al. | |
| 7,945,800 B2 | 5/2011 | Gomm et al. | |
| 7,948,817 B2 | 5/2011 | Coteus et al. | |
| 7,969,813 B2 | 6/2011 | Bringivijayaraghavan et al. | |
| 7,983,094 B1* | 7/2011 | Roge et al. | 365/189.011 |
| 8,004,884 B2 | 8/2011 | Franceschini et al. | |
| 8,018,791 B2 | 9/2011 | Kwak | |
| 8,030,981 B2 | 10/2011 | Kim | |
| 8,116,415 B2* | 2/2012 | Wada et al. | 375/355 |
| 8,144,529 B2 | 3/2012 | Chuang et al. | |
| 8,321,714 B2* | 11/2012 | Wu et al. | 713/401 |
| 8,358,546 B2 | 1/2013 | Kim et al. | |
| 8,392,741 B2 | 3/2013 | Kim et al. | |
| 8,441,888 B2 | 5/2013 | Bringivijayaraghavan et al. | |
| 8,509,011 B2 | 8/2013 | Bringivijayaraghavan | |
| 8,644,096 B2 | 2/2014 | Bringivijayaraghavan | |
| 8,717,078 B2* | 5/2014 | Idgunji et al. | 327/202 |
| 8,788,896 B2* | 7/2014 | Tekumalla | 714/726 |
| 9,001,955 B2 | 4/2015 | Lamanna et al. | |
| 2001/0015924 A1 | 8/2001 | Arimoto et al. | |
| 2002/0057624 A1 | 5/2002 | Manning | |
| 2003/0117864 A1 | 6/2003 | Hampel et al. | |
| 2005/0024107 A1 | 2/2005 | Takai et al. | |
| 2005/0047222 A1* | 3/2005 | Rentschler | 365/193 |
| 2005/0132043 A1 | 6/2005 | Wang et al. | |
| 2005/0270852 A1 | 12/2005 | Dietrich et al. | |
| 2006/0062341 A1 | 3/2006 | Edmondson et al. | |
| 2006/0155948 A1 | 7/2006 | Ruckerbauer | |
| 2006/0182212 A1 | 8/2006 | Hwang et al. | |
| 2006/0193194 A1* | 8/2006 | Schnell | 365/233 |
| 2007/0033427 A1 | 2/2007 | Correale, Jr. et al. | |
| 2007/0046346 A1* | 3/2007 | Minzoni | 327/158 |
| 2007/0088903 A1 | 4/2007 | Choi | |
| 2007/0192651 A1 | 8/2007 | Schoch | |
| 2007/0291558 A1* | 12/2007 | Joo | 365/194 |
| 2008/0080267 A1 | 4/2008 | Lee | |
| 2008/0080271 A1 | 4/2008 | Kim | |
| 2008/0082707 A1 | 4/2008 | Gupta et al. | |
| 2008/0144423 A1 | 6/2008 | Kwak | |
| 2009/0232250 A1* | 9/2009 | Yamada et al. | 375/295 |
| 2009/0315600 A1 | 12/2009 | Becker et al. | |
| 2010/0001762 A1 | 1/2010 | Kim | |
| 2010/0066422 A1 | 3/2010 | Tsai | |
| 2010/0124090 A1 | 5/2010 | Arai | |
| 2010/0124102 A1 | 5/2010 | Lee et al. | |
| 2010/0165769 A1 | 7/2010 | Kuroki | |
| 2010/0165780 A1 | 7/2010 | Bains et al. | |
| 2010/0195429 A1 | 8/2010 | Sonoda | |
| 2010/0199117 A1 | 8/2010 | Kwak | |
| 2010/0232213 A1 | 9/2010 | Hwang et al. | |
| 2010/0254198 A1 | 10/2010 | Bringivijayaraghavan et al. | |
| 2011/0047319 A1* | 2/2011 | Jeon et al. | 711/103 |
| 2011/0055671 A1 | 3/2011 | Kim et al. | |
| 2011/0102039 A1 | 5/2011 | Shin | |
| 2011/0228625 A1 | 9/2011 | Bringivijayaraghavan | |
| 2011/0238866 A1 | 9/2011 | Zitlaw | |
| 2011/0238941 A1 | 9/2011 | Xu et al. | |
| 2011/0298512 A1 | 12/2011 | Kwak | |
| 2011/0314324 A1 | 12/2011 | Ozdemir | |
| 2012/0084575 A1 | 4/2012 | Flores et al. | |
| 2012/0124317 A1 | 5/2012 | Mirichigni et al. | |
| 2012/0212268 A1 | 8/2012 | Kim | |
| 2012/0254873 A1 | 10/2012 | Bringivijayaraghavan | |
| 2012/0269015 A1 | 10/2012 | Bringivijayaraghavan | |
| 2012/0274376 A1 | 11/2012 | Gomm et al. | |
| 2013/0141994 A1* | 6/2013 | Ito et al. | 365/193 |
| 2013/0194013 A1 | 8/2013 | Kwak | |
| 2013/0250701 A1 | 9/2013 | Bringivijayaraghavan et al. | |
| 2013/0329503 A1 | 12/2013 | Bringivijayaraghavan | |
| 2013/0342254 A1 | 12/2013 | Mazumder et al. | |
| 2014/0010025 A1 | 1/2014 | Bringivijayaraghavan | |
| 2014/0035640 A1 | 2/2014 | Kwak et al. | |
| 2014/0055184 A1 | 2/2014 | Vankayala | |
| 2014/0119141 A1 | 5/2014 | Tamlyn et al. | |
| 2014/0176213 A1 | 6/2014 | Rylov | |
| 2014/0177359 A1* | 6/2014 | Kumar et al. | 365/194 |
| 2014/0258764 A1 | 9/2014 | Kwak | |

OTHER PUBLICATIONS

"Interfacing DDR SDRAM with Stratix II Devices", Version 3.2, Altera Corp, Sep. 2008.

Lee, "How to Implement DDR SGRAM in Graphic System", Samsung Electric, 1998.

Office Action received for KR Appln No. 10-2013-7027649, dated Jan. 30, 2015, 5 pages.

\* cited by examiner

METHODS AND APPARATUSES FOR SHIFTING DATA SIGNALS TO MATCH COMMAND SIGNAL DELAY

TECHNICAL FIELD

Embodiments of the present invention described herein relate generally to memories, and more particularly, in one or more of the illustrated embodiments, to shifting data signals, for example, in memory systems.

BACKGROUND OF THE INVENTION

In semiconductor memory, proper operation of the memory is based on the correct timing of various internal command, data, and clock signals. For example, in writing data to memory internal clock signals that clock data path circuitry to latch write data may need to be provided with specific timing relationships with internal write command signals to properly enable the data path circuitry to provide the latched write data for writing to memory. If the timing of the internal write command signal is not such that the data path circuitry is enabled at the time the internal clock signal clocks the data path circuitry to provide the write data at an expected time, the write command may be inadvertently ignored or the write data provided to the memory may not be correct (e.g., the write data is associated with another command).

Thus, internal clock, data, and write command paths should be designed to provide propagation delays for the respective signals to account for latency, for example, write latency between receipt of a write command and receipt of the write data for the write command. Other examples of commands that may require the correct timing of internal clock, data, and command signals for proper operation include, for example, read commands and on-die termination enable commands.

An example conventional approach to maintaining the timing of internal write command, data, and clock signals is modeling both the clock and data path, and the write command path to have the same propagation delay using, for instance, a plurality of logic gates, such as inverters or buffers. Because logic gates may add a relative small amount of delay, the number of gates used may often be higher than desirable.

DETAILED DESCRIPTION

Methods and apparatuses for shifting data signals are disclosed herein. In accordance with one or more embodiments of the present invention, data may be shifted through a delay path based, at least in part, on one or more clock signals. Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
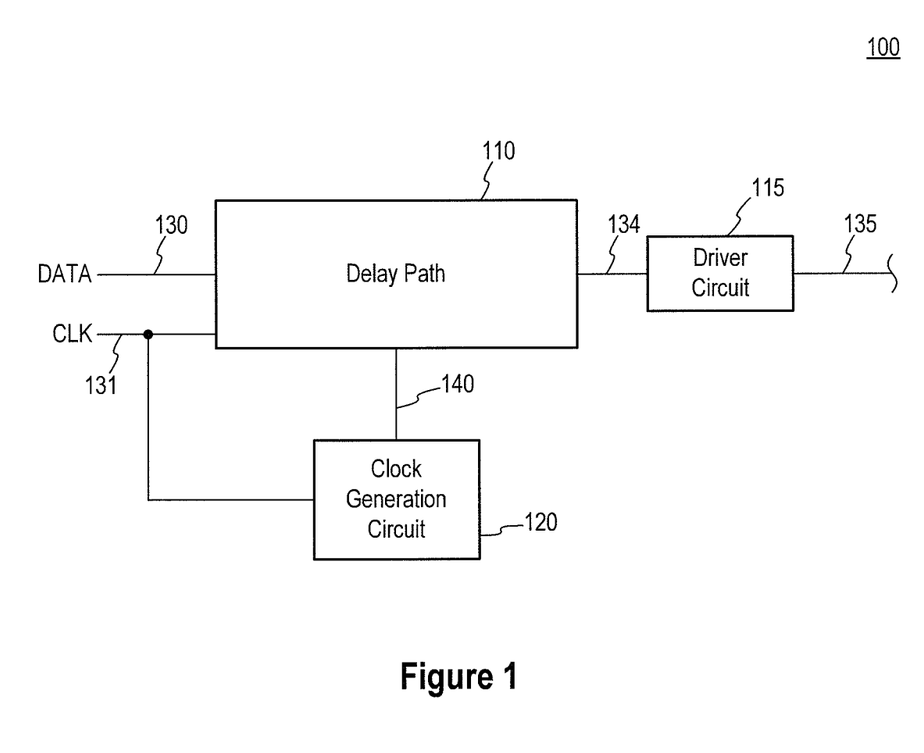
FIG. 1 is a block diagram of an apparatus according to an embodiment of the invention.

FIG. 1 illustrates an apparatus 100 according to an embodiment of the invention. The apparatus 100 may comprise circuitry, one or semiconductor dice, a packaged semiconductor, a device including such circuitry, die, or package, and/or a system including such a device. The apparatus 100 may include a delay path 110, a clock generation circuit 120, and a driver circuit 115. The apparatus 100 may be included in a data path that provides input data provided to the data path input to a circuit coupled to the data path output. The delay path 110 may be coupled to the clock generation circuit 120 and the driver circuit 115, and further may be configured to receive a data signal DATA from the bus 130 and a clock signal CLK from the bus 131. The delay path 110 may include one or more logic circuits, control logic, logic gates, and/or any combination or sub-combination of the same. The clock generation circuit 120 may be configured to receive the data signal DATA and the clock signal CLK. The data signal DATA may include bits of data, and in at least one embodiment, may include write data that may correspond to a write command. The write data is provided to a circuit or circuits that are used for writing the write data to memory, for example. The clock signal CLK may be a periodic signal, and may be based, at least in part, on an external clock signal.

The clock generation circuit 120 may be any clock generator known in the art, such as a multi-phase clock generator, and may be configured to generate a plurality of clock signals based, at least in part, on the clock signal CLK. The clock generation circuit 120 may further provide the plurality of clock signals to a bus, such as the bus 140. Each of the plurality of clock signals may have a respective phase shift relative to the clock signal CLK and/or may have a same frequency as the clock signal CLK. Moreover, each of the plurality of clock signals may have a same frequency and duty cycle, or may have varying frequencies and/or duty cycles.

The driver circuit 115 may include one or more drivers and may be configured to provide (e.g., drive) one or more respective signals to a bus. For example, the driver circuit 115 may be configured to receive a data signal from bus 134, and provide the signal to a circuit, such as a memory array (not shown in FIG. 1), over bus 135. Each of the drivers included in the driver circuit 115 (not shown) may be conventional drivers as known in the art and will not be discussed in detail in the interest of brevity.

The delay path 110 may be configured to receive the data signal DATA and delay the data signal DATA based, at least in part, on the clock signal CLK and/or one or more of the plurality of clock signals from the clock generation circuit 120. As an example, the delay path 110 may sequentially shift the data signal DATA through one or more latches to delay propagation of the data signal DATA to the driver circuit 115. In at least one embodiment, this delay may be configured to match the delay resulting from the propagation of a command through a memory and/or from decoding the command (e.g., write command). This may, for example, allow the data signal DATA and corresponding decoded command signals to be provided to a circuit (not shown) at approximately the same time.

In an example operation of the apparatus 100, the clock signal CLK may be provided to the delay path 110 and the clock generation circuit 120. The clock generation circuit 120 may generate a plurality of clock signals based, at least in part, on the clock signal CLK and may provide each of the clock signals to the delay path 110 via the bus 140. The delay path 110 may further receive the data signal DATA and may delay the data signal DATA. The data signal DATA may be delayed by a particular amount or may be delayed by an amount that is adjusted dynamically, for instance, based on a temperature. The delay path 110 may delay the data signal DATA based, at least in part, on the data signal DATA and/or the plurality of clock signals from the clock generation circuit 120. As described, in one embodiment, the plurality of clock signals may be used to shift the data signal DATA through the delay path 110. The data signal DATA, once delayed, may be provided to the driver 115 over the bus 134, and thereby driven, for instance, to a circuit over the bus 135.

Figure 2:
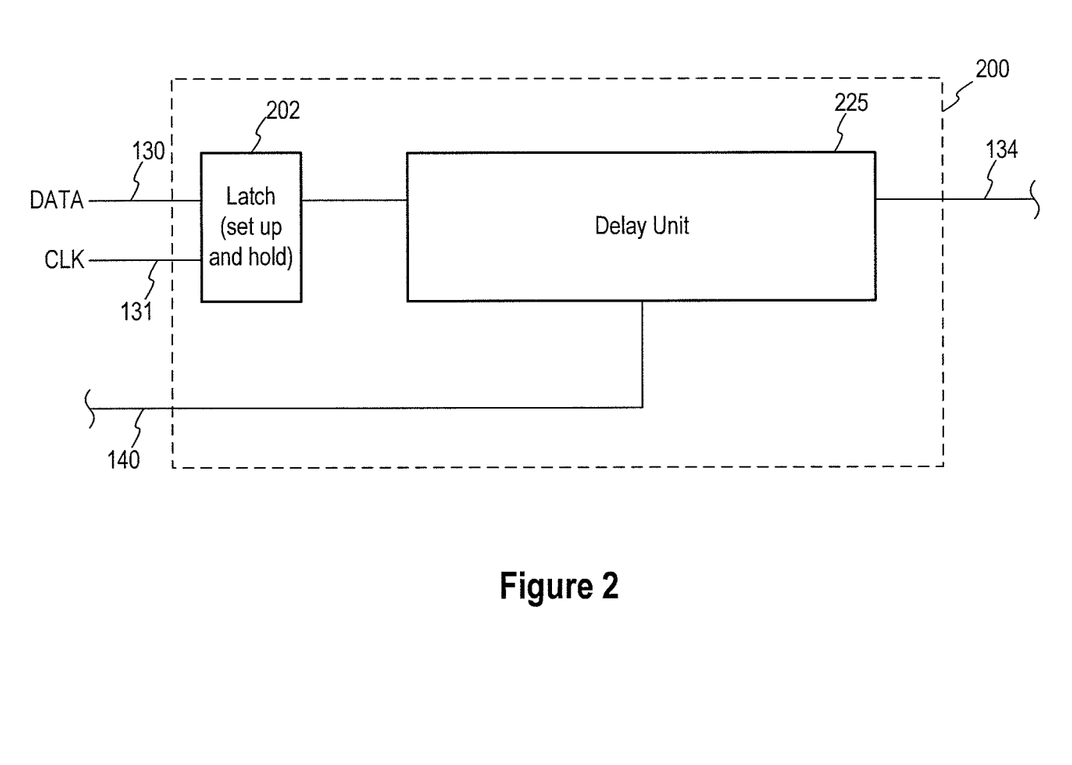
FIG. 2 is a block diagram of a delay path that may be used in the apparatus of FIG. 1 according to an embodiment of the invention.

FIG. 2 is a block diagram of a delay path 200 according to an embodiment of the invention. The delay path 200 may be used to implement the delay path 110 of FIG. 1. The delay path includes a setup and hold unit (SUH) 202 and a delay unit 225. The SUH unit 202 may be coupled to an input of the delay unit 225, and may be configured to receive the data signal DATA and the clock signal CLK. The SUH unit 202 may further be configured to delay the data signal DATA based, at least in part, on the clock signal CLK. In at least one embodiment, delaying the data signal DATA with the SUH unit 202 may setup and hold one or more bits of the data signal DATA such that the data signal DATA may be properly delayed by the delay unit 225. For example, the SUH unit 202 may increase the amount of time in which each bit of the data signal DATA is provided to the delay unit 225. The delay unit 225 may be configured to receive the plurality of clock signals, for example, from a clock generation circuit, and may further receive the data signal DATA after it has been delayed by the SUH unit 202. The delay unit 225 may be configured to further delay the data signal DATA and provide the data signal DATA to the bus 134. The amount in which the data signal DATA is delayed by the SUH unit 202 and/or the delay unit 225 may be based, at least in part, on the amount of time required to provide and/or decode a command corresponding to the data signal DATA.

Figure 3:
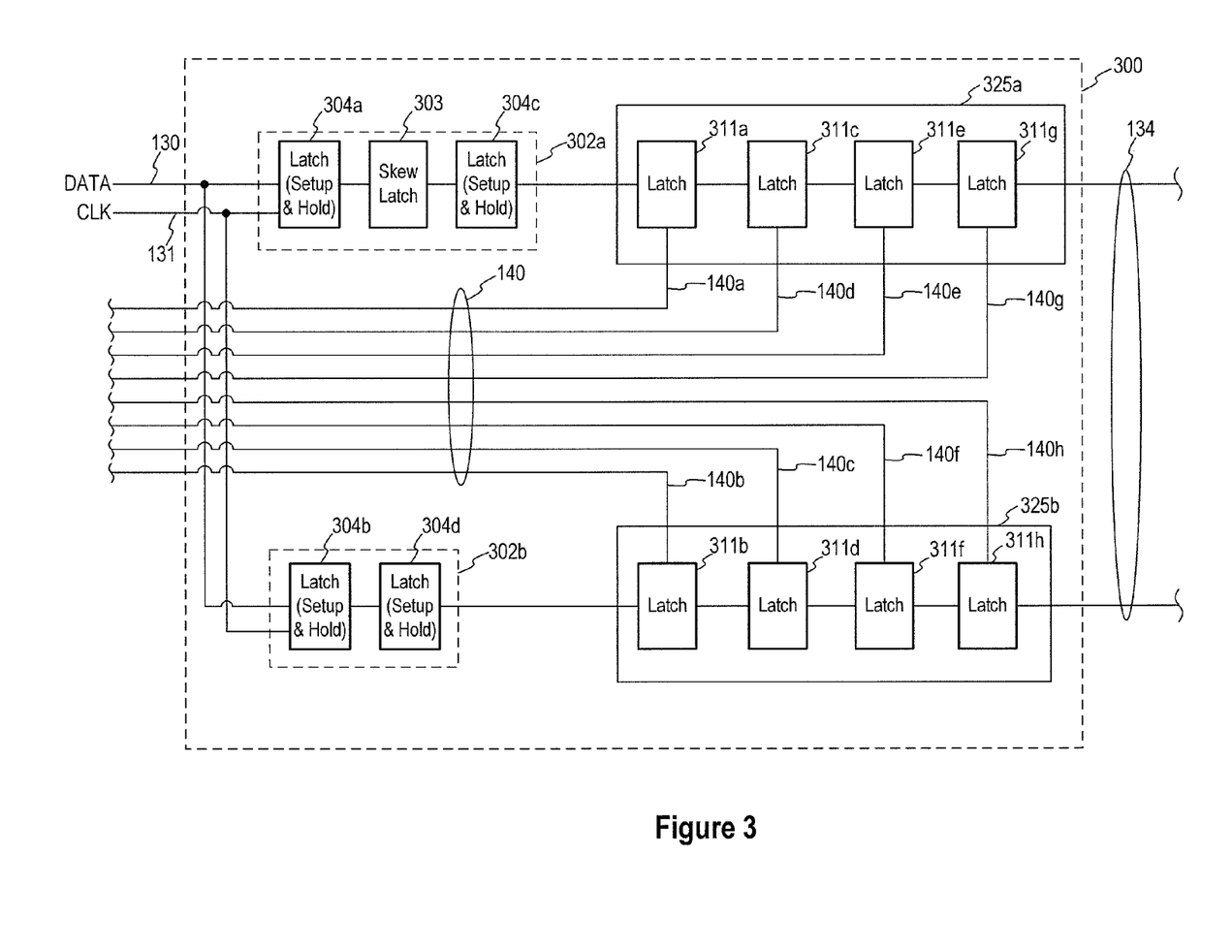
FIG. 3 is a block diagram of a delay path that may be used in the apparatus of FIG. 1 according to an embodiment of the invention.

FIG. 3 is a block diagram of a delay path 300 according to an embodiment of the invention. The delay path 300 may be used to implement the delay path 110 of FIG. 1. The delay path 300 includes setup and hold (SUH) units 302a,b, and delay units 325a,b. The SUH unit 302a and/or the SUH unit 302b may be similar to the SUH unit 202 of FIG. 2 and each may be configured to receive the data signal DATA and the clock signal CLK. The SUH unit 302a may include SUH latches 304a,c and a skew latch 303, and the SUH unit 302b may include SUH latches 304b,d. Each of the SUH latches 304a-d and the skew latch 303 may be configured to latch and/or delay received bits of a data signal. The SUH latches may be any half-latch or latch known in the art, and may be coupled in respective series configurations, as illustrated in FIG. 3. In some embodiments, the SUH latches 304a-d and/or the skew latch 303 may be gated latches and/or may be configured to be transparent responsive to an input clock having or transitioning to a particular logic state. The delay units 325a,b may be similar to the delay unit 225 of FIG. 2 and may be coupled to the SUH units 302a,b, respectively. Each delay unit 325 may be configured to receive a respective set of the plurality of clock signals over the bus 140, as described in more detail below.

Each delay unit 325 may include a plurality of latches 311. For example, delay unit 325a may include latches 311a, 311c, 311e, and 311g, and delay unit 325b may include latches 311b, 311d, 311f, and 311h. Each latch 311 may receive a respective one of the plurality of clock signals generated by the clock generation circuit 120 and having a phase shift relative to the clock signal CLK of FIG. 1. In some embodiments, each latch 311 of the delay unit 325a may receive one of a first respective set of the plurality of clock signals generated by the clock generation circuit 120 and each latch 311 of the delay unit 325b may receive one of a second respective set of the plurality of clock signals generated by the clock generation circuit 120. In at least one embodiment, each respective set of the plurality of clock signals may comprise the same signals such that pairs of latches may share a same respective clock signal. For example, latches 311a and 311b may each be configured to receive a same clock signal over busses 140a and 140b, respectively, latches 311c and 311d may each be configured to receive a same clock signal over busses 140c and 140d, respectively, and so forth. In other embodiments, each latch 311 may receive its own respective clock signal from a respective bus 140. Delay units 325 may each include any number of latches 311. The latches 311 may be implemented, for example, as half-latches, D-latches, gated latches, positive edge triggered latches, negative edge triggered latches, flip-flops, and/or any other latches known by those having ordinary skill in the art, now or in the future.

Latches included in each of the delay units 325a,b may be configured in a series configuration. For example, as illustrated in FIG. 3, an output of the latch 311a may be coupled to an input of the latch 311c, the output of the latch 311c may be coupled to the input of the latch 311e, etc. The first latch 311 of each series configuration, the latches 311a and 311b included in the delay units 325a and 325b, respectively, may be configured to receive respective bits of the data signal DATA from the SUH latches 302a and 302b, respectively. The last latch 311 of each series configuration, the latches 311g and 311h included in the delay units 325a and 325b, respectively, may be configured to provide respective bits of the data signal DATA to the bus 134. As will be explained, delay units 325a and 325b may shift respective bits of the data signal DATA through latches 311 until the entirety of the data signal DATA has been provided to the bus 134.

In an example operation of the delay path 300, the data signal DATA may be serially provided to each of the SUH units 302. As will be explained in more detail below, the first bit of the data signal DATA may be latched by the SUH unit 302a and subsequently provided to the delay unit 325a after a delay, and the second bit of the data signal DATA may be latched by the SUH unit 302b and subsequently provided to the delay unit 325b after a delay. Based, at least in part, on the respective clock signals provided to each of the latches 311, the first and second bits may be shifted through respective latches 311 of the delay units 325a and 325b until the first and second bits are provided to the bus 134.

In this manner, additional bits of the data signal DATA may also be latched by the SUH units 302 and shifted through the delay units 325 as well. For example, the SUH units 302a and 302b may alternate latching bits of the data signal DATA until all bits of the data signal DATA have been received. In one embodiment, the SUH unit 302a and the delay unit 325a may be configured to latch and shift even bits of the data signal DATA, and the SUH unit 302b and the delay unit 325b may be configured to latch and shift odd bits of the data signal DATA.

As an example, delay unit 325a may receive bits 0, 2, 4, 6, etc., and the delay unit 325b may receive bits 1, 3, 5, 7, etc.

Moreover, the SUH unit 302a may include a skew latch 303 coupled between the SUH latches 302a,c. The skew latch 303 may be configured to delay the shifting of the data signal DATA through the SUH unit 302a by a predetermined amount, such as one half of a clock cycle of the clock signal CLK. This additional delay may, for instance, align the shift of respective bits of the data signal DATA through each of the delay units 325. For example, because the first bit of the signal will arrive at the delay path 300 before the second bit, the first bit may be latched by the SUH latch 304a before the second bit is latched by the SUH latch 304b. Assuming that the second bit is latched by the SUH latch 304b half of a clock cycle later, by delaying the first bit with the skew latch 303 the first and second bits may be aligned such that the bits are shifted through each delay unit 325 and/or provided to the bus 134 at approximately the same time. Subsequent bits of the data signal DATA may be adjusted in a same manner. While in one embodiment, such as the embodiment in FIG. 3, the skew latch 303 is included in the SUH unit 302a, in other embodiments, the skew latch 303 may be elsewhere in the delay path 300. For example, in one embodiment, the skew latch may be coupled between the latch 311g and the bus 134, thereby aligning bits of the data signal DATA before each respective bit is provided to the bus 134.

Figure 4:
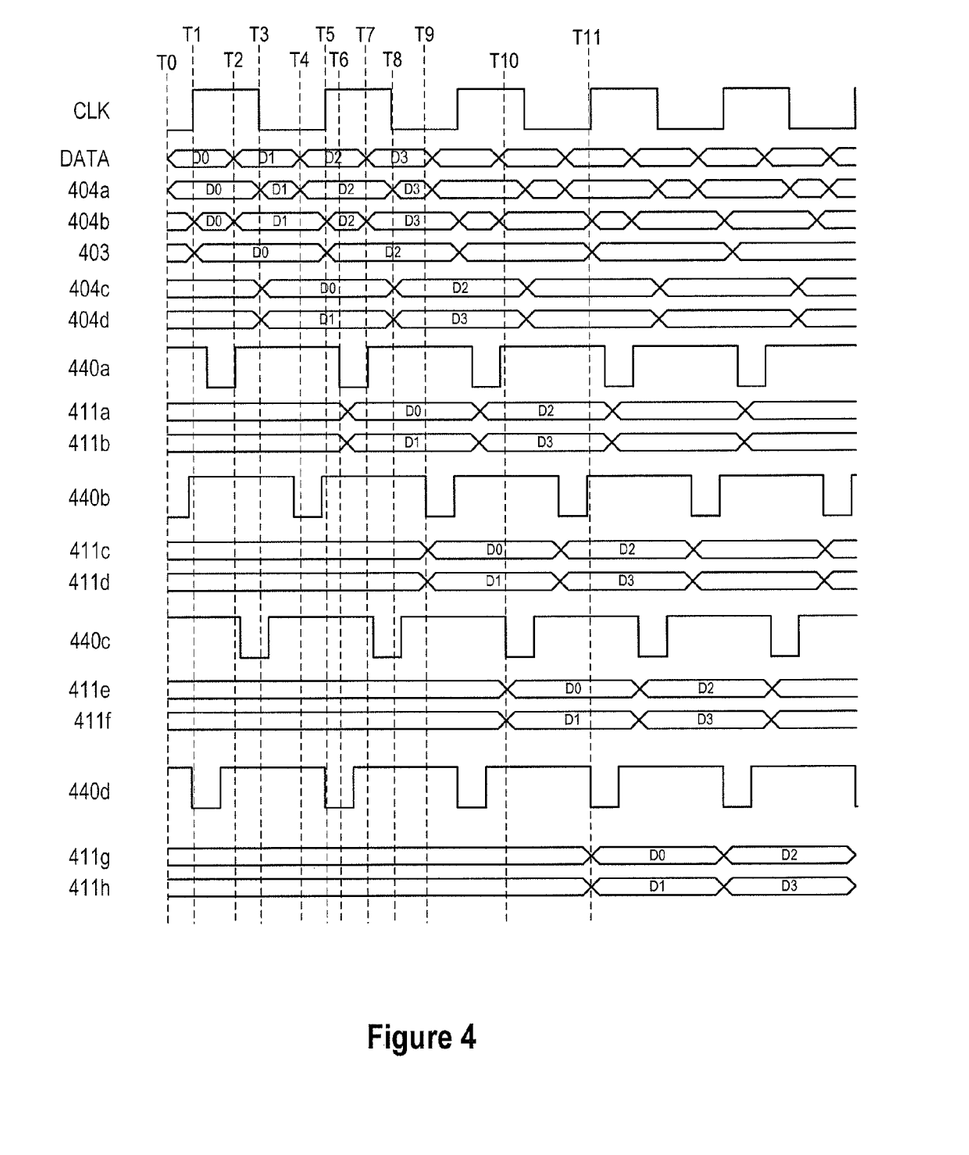
FIG. 4 is a timing diagram of an operation of the apparatus of FIG. 1 according to an embodiment of the invention.

FIG. 4 is a timing diagram 400 of an example operation of the apparatus 100 of FIG. 1 according to an embodiment of the invention. The timing diagram 400 of FIG. 4 includes the data signal DATA, clock signals CLK and 440a-d, SUH latch signals 404a-d, skew latch signal 403, and latch signals 411a-h. With reference to FIG. 3, the SUH latch signals 404a-d are provided by SUH latches 304a-d, the skew latch signal 403 are provided by the skew latch 303, and latch signals 411a-h are provided by latches 311a-h. As described, pairs of latches 311 may receive a same clock signal over respective busses. Thus clock signals 440a-d are clock signals provided to latches 311a and 311b, 311c and 311d, 311e and 311f, and 311g and 311h, respectively. Moreover, reference is made herein to a data signal DATA including data bits D0, D1, D2, and D3 and delay units 325 including four latches 311, each as an example only. The operation described herein may be applicable to data signals DATA and/or delay units 325 comprising any number of bits and/or latches, respectively.

As described, the SUH latches 304 may be gated latches. Thus, in one embodiment, the SUH latch 304a may be configured to be transparent responsive to a logic low clock signal CLK and the SUH latch 304b may be configured to be transparent responsive to a logic high clock signal CLK. Accordingly, when the data bit D0 of the data signal DATA is be provided to SUH latches 304a,b at a time T0, because the clock signal CLK is at a logic low, the signal 404a provided by the SUH latch 304a is the data bit D0, and the signal 404b provided by the SUH latch 304b is whatever data was previously latched when the clock signal CLK was a logic high. At time T1, the clock signal CLK may transition, for example, from a logic low to a logic high, and in response, the SUH latch 304a may latch and the signal 404a will continue to be D0. The signals 403 and 404b may transition to D0 based on the skew latch 303 latching and the SUH latch 304b becoming transparent, respectively.

At time T2, the second bit of the data signal DATA, data bit D1 is provided to the SUH latches 304a,b. Because at time T2 the SUH latch 304a is latched, the signal 404a remains at D0. The signal 404b, however, may transition to D1 in response to the SUH latch 304b becoming transparent. At time T3 the clock signal CLK transitions from a logic high to a logic low. In response, the SUH latches 304c,d may latch, and signals 404c,d may be D0 and D1, respectively. The transition may further cause the SUH latch 304a to become transparent and SUH latch 304b to latch its input. As a result, signals 404a,b may both be data bit D1.

At time T4, a third bit of the data signal DATA, data bit D2, may be provided to the SUH latches 304a,b. Because at time T4 the SUH latch 304a may be transparent and the SUH latch 304b may be latched, signal 404a may transition to data bit D2 and signal 404b may be held at D1. At time T5, clock signal CLK may transition to a logic high. In response, SUH latches 304a,b may latch and become transparent, respectively, and both signals 304a,b may comprise data bit D2. Moreover, skew latch 303 may latch based, at least in part, on the rising edge of the clock signal CLK, causing signal 403 to be data bit D2. At time T6, the clock signal 440a may transition, for example, from a logic high to a logic low. In response to the falling edge, both the latch 311a of the delay unit 325a and latch 311b of the delay unit 325b may latch. Corresponding signals 411a,b, as a result, may be D0 and D1, respectively.

At time T7, the fourth bit of the data signal DATA, data bit D3, may be provided. Because the SUH latch 304a may be latched, the signal 404a is data bit D2. The SUH latch 304b may be transparent, and as a result, signal 404b is data bit D3. At time T8, clock signal CLK may transition, for example, to a logic low state. As described, this may cause SUH latch 304a to be transparent and SUH latch 304b to latch. Signals 404a,b therefore may both be data bit D3. Additionally, in response to the falling edge of the clock signal CLK, SUH latches 304c,d may latch data bits D2 and D3, respectively. At time T9, the clock signal 440b may transition, for example, to a logic low, and in response, latches 311c,d may latch, causing signals 411c,d to be data bits D0, D1. The data bits D0 and D1 may be further shifted through respective delay units 325 at times T10 and T11, respectively, based, at least in part, on the clock signals 440c and 440d. As described, the final latch in each delay unit 325, for example, latches 311g,h, may provide the data bits D0 and D1 to the bus 134. Data bits D2 and D3 may likewise be shifted based on the clock signals 440 until each is provided to the bus 134.

Accordingly, by shifting the data signal DATA through latches of both the setup and hold units 302 and the delay units 325, the data signal DATA may be delayed based on a plurality of clock signals, including the clock signal CLK and the plurality of clock signals 440. The delay may be adjusted, for example, by adjusting the number of latches or the frequency of the clock signal CLK and/or plurality of clock signals generated by the clock generation circuit 120. As described, this may, for instance, allow for the data signal DATA to be provided to a device, such as a circuit, at the same time as a corresponding memory command or decoded command signals.

Figure 5:
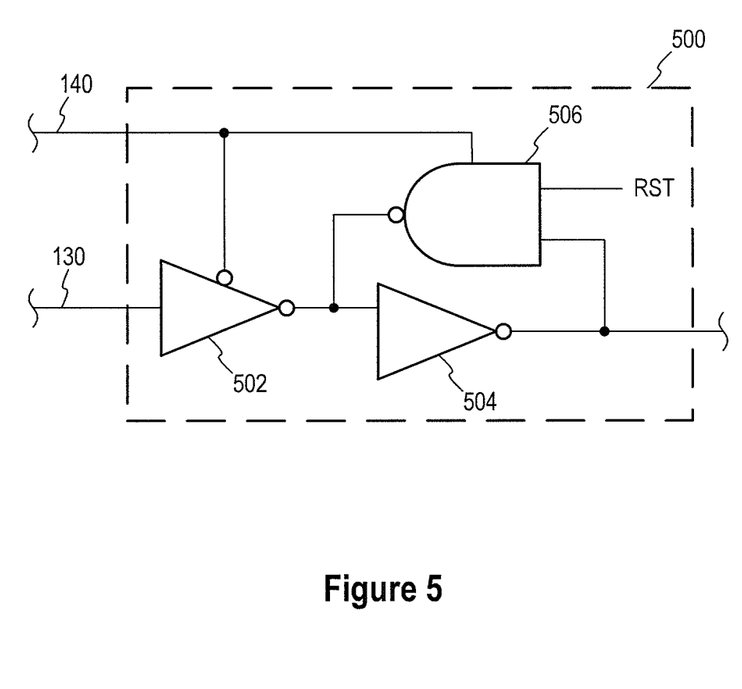
FIG. 5 is a schematic diagram of a latch that may be used in the apparatus of FIG. 3 according to an embodiment of the invention.

FIG. 5 is a schematic diagram of a latch 500 according to an embodiment of the invention. The latch 500 may be used to implement any of the latches 311 of FIG. 3. The latch 500 may include inverters 502, 504 and a NAND gate 506. The inverters 502, 504 may be complementary metal oxide semiconductor ("CMOS") inverters, or may be other inverters known in the art, such as n-channel or p-channel MOS inverters. The inverter 502 may be configured to receive a signal and provide a complementary signal to an input of the inverter 504. The input of the inverter 504 may further be coupled to an output of the NAND gate 506. The output of the inverter 504 may be coupled to an input of the NAND gate 506 and may comprise an output of the latch 500. The NAND gate 506 may receive a reset signal RST that may, for instance, be set to a known logic level to prevent the latch 500 from floating during an initialization of an apparatus, such as the apparatus 100. Both the inverter 502 and the NAND gate 506 may further be configured to receive a clock signal, such as one of the plurality of clock signals generated by the clock generation circuit 120 of FIG. 1, and may be selectively enabled based, at least in part, on the one of the plurality of clock signals. In at least one embodiment, the inverter 502 and the NAND 506 may be configured such that only one of the devices is selectively enabled at a given time. This may, for example, prevent both devices from providing (e.g., driving) a signal to the input of the inverter 504 simultaneously. Moreover, in some embodiments, the inverter 502 and the NAND gate 506 may be selectively enabled based a complement of the clock signal (not shown) in addition to, or instead of, the clock signal.

In an example operation of the latch 500, a bit of the data signal DATA may be provided to the inverter 502 from, for example, a latch 311 or the setup and hold latch 302 of FIG. 3. Responsive, at least in part, to the clock signal having a logic low state, the inverter 502 may be selectively enabled and the NAND gate 506 may be selectively disabled. A complement of the bit of the data signal may be provided to the inverter 504 by the inverter 502. The inverter 504 may recover the bit of the signal from its complement and provide the bit to both the NAND gate 506 and the output of the latch 500. The clock signal may transition to a logic high state, causing the inverter 504 to be selectively disabled and the NAND gate 506 to be selectively enabled. The NAND gate 506 and the inverter 504 may hold the bit for the duration of the time that the clock signal remains in a logic low state, providing the bit of the signal at the output of the latch 500 during that period of time.

Figure 6:
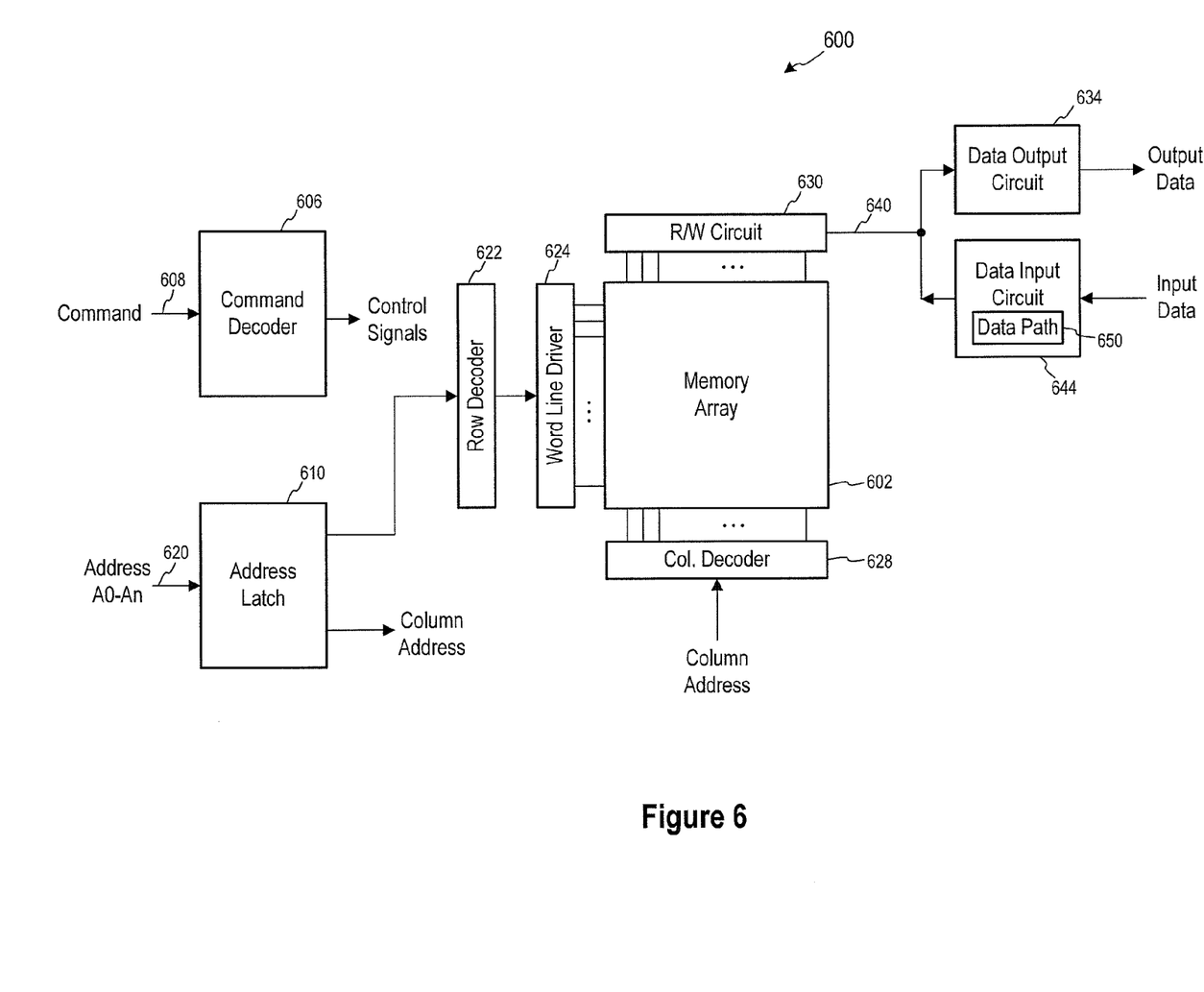
FIG. 6 is a block diagram of a memory that may include the apparatus of FIG. 1 according to an embodiment of the invention.

FIG. 6 illustrates a block diagram of a portion of a memory 600 according to an embodiment of the invention. The memory 600 includes an array 602 of memory cells, which may be, for example, DRAM memory cells, SRAM memory cells, flash memory cells, or some other types of memory cells. The memory 600 includes an address/command decoder 606 that receives memory commands and addresses through an ADDR/CMD bus. The address/command decoder 606 generates control signals, based on the commands received through the ADDR/CMD bus. The address/command decoder 606 also provides row and column addresses to the memory 600 through an address bus and an address latch 610. The address latch then outputs separate column addresses and separate row addresses.

The row and column addresses are provided by the address latch 610 to a row address decoder 622 and a column address decoder 628, respectively. The column address decoder 628 selects lines extending through the array 602 corresponding to respective column addresses. The row address decoder 622 is connected to word line driver 624 that activates respective rows of memory cells in the array 602 corresponding to received row addresses. The selected line (e.g., a bit line or bit lines) corresponding to a received column address are coupled to a read/write circuitry 630 to provide read data to a data output circuit 634 via an input-output data bus 640. Write data are provided to the memory array 602 through a data path 650 of the data input circuit 644 and the memory array read/write circuitry 630. The data path 650 may comprise an apparatus according to an embodiment of the invention, such as the apparatus 100, and may delay write data as described herein.

At least a portion of the data output circuit 634 may include an apparatus 640 that includes an encoding circuit and driver circuit, such as those previously described with reference to the apparatus 100 according to an embodiment of the invention. In addition to, or in place of, the apparatus 640 of the data output circuit 634, an apparatus 640 may also be included on input-output data bus 640, in between the memory array 602 and the read/write circuitry 630, or in any other location in the memory 600.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
    a clock generation circuit configured to receive an input clock signal and generate a plurality of clock signals based, at least in part, on the input clock signal;
    a delay path coupled to the clock generation circuit and configured to receive the input clock signal and the plurality of clock signals, the delay path further configured to receive a data signal and delay the data signal based, at least in part, on the input clock signal and each of the plurality of clock signals; and
    a driver coupled to the delay path and configured to receive the delayed data signal, the driver further configured to provide the delayed data signal to a bus,
    wherein the delay path comprises a plurality of latches coupled in series, each latch of the plurality of latches configured to receive one of the plurality of clock signals.

2. The apparatus of claim 1, wherein the data signal comprises a write data signal and the bus is coupled to a memory array.

3. The apparatus of claim 1, wherein each of the latches comprises:
    a first inverter configured to drive an output;
    a second inverter coupled to an input of the first inverter and configured to receive a data signal, the second inverter further configured to provide a first input signal to the input of the first inverter based, at least in part, on the data signal;
    a NAND gate coupled to the output and the input of the first inverter, the NAND gate further configured to provide a second input signal to the input of the first inverter based, at least in part, on the output; and
    wherein at least one of the second inverter or the NAND gate are configured to be selectively enabled based, at least in part, on one of the plurality of clock, signals.

4. The apparatus of claim 1, wherein the delay path is further configured to delay the data signal based, at least in part, on the delay of a write command.

5. An apparatus, comprising:
    a clock generation circuit configured to receive an input clock signal and generate a plurality of clock signals based, at least in part, on the input clock signal;
    a delay path coupled to the clock generation circuit and configured to receive the input clock signal and the plurality of clock signals, the delay path further configured to receive a data signal and delay the data signal based, at least in part, on the input clock signal and each of the plurality of clock signals, wherein the delay path comprises:
    a setup and hold unit configured to receive the data signal and the input clock signal and delay the data signal by a first delay based, at least in part, on the input clock signal; and
    a delay unit coupled to the setup and hold unit and configured to receive the data signal after the first delay and the plurality of clock signals, the delay unit further configured to delay the data signal by a second delay based, at least in part, on the plurality of clock signals; and a driver coupled to the delay path and configured to receive the delayed data signal, the driver further configured to provide the delayed data signal to a bus, wherein the delay path comprises a plurality of latches coupled in series, each latch of the plurality of latches configured to receive one of the plurality of clock signals.

6. The apparatus of claim 5, wherein the second delay comprises a plurality of delays, each of the plurality of delays based, at least in part, on a respective one of the plurality of clock signals.

7. An apparatus comprising:

a clock generation circuit configured to receive an input clock signal and generate a plurality of clock signals based, at least in part, on the input clock signal; and a delay path coupled to the clock generation circuit, comprising:

a first setup and hold unit configured to receive a data signal and latch a first bit of the data signal;

a second setup and hold unit configured to receive the data signal and latch a second bit of the data signal;

a first delay unit coupled to the first setup and hold unit and configured to receive the first bit of the data signal, the first delay unit further configured to delay the first bit of the data signal using a first plurality of latches;

a second delay unit coupled to the second setup and hold unit and configured to receive the second bit of the data signal, the second delay unit further configured to delay the second bit of the data signal using a second plurality of latches; and wherein each of the first plurality of latches is configured to delay the first bit of the data signal based, at least in part, on a respective one of a first set of the plurality of clock signals and each of the second plurality of latches is configured to delay the second bit of the data signal based, at least in part, on a respective one of a second set of the plurality of clock signals, wherein the first setup and hold unit comprises a skew configured to delay the first bit of the data signal one-half of a clock cycle of the input clock signal.

8. The apparatus of claim 7, wherein the first and second sets of the plurality of clock signals comprise a same plurality of clock signals.

9. The apparatus of claim 7, further comprising:

a driver circuit coupled to the first and second delay units and configured to receive the first and second bits of the data signal, the driver circuit further configured to provide the first and second bits of the data signal to a memory array.

10. The apparatus of claim 7, wherein the first setup and hold unit is configured to latch the first bit based, at least in part, on the input clock signal and the second setup and hold unit is configured to latch the second bit based, at least in part, on the input clock signal.

11. The apparatus of claim 10, wherein the first setup and hold unit is further configured to latch the first bit responsive, at least in part, to receipt of a rising edge of the input clock signal and the second setup and hold unit is further configured to latch the second bit responsive, at least in part, to receipt of a falling edge of the input clock signal.

12. The apparatus of claim 7, wherein the apparatus is included in a memory.

13. A method, comprising:

generating a plurality of clock signals based on an input clock signal;

delaying a first bit of a data signal a first amount;

delaying a second bit of the data signal a second amount; and delaying the first and second bits of the data signal by a third amount based, at least in part, on the plurality of clock signals, wherein the first and second amounts are based, at least in part, on the input clock signal and wherein said delaying a first bit of a data signal a first amount, comprises delaying the first bit one-half of a clock cycle of the input clock signal.

14. The method of claim 13, further comprising:

providing the first and second bits to a bus at approximately the same time.

15. The method of claim 13, wherein said delaying the first and second bits comprises:

shifting the first bit through a first plurality of latches; and shifting the second bit through a second plurality of latches.

16. A method, comprising:

latching a first data bit with a first setup and hold unit to delay the first data bit one-half of a clock cycle of a clock signal;

after latching the first data bit, latching a second data it with a second setup and hold unit; and shifting the first data bit through a first plurality of latches based, at least in part, on a first plurality of clock signals;

shifting a second data bit through a second plurality of latches based, at least in part, on a second plurality of clock signals; and wherein the first and second pluralities of latches are configured in series.

17. The method of claim 16, wherein each of the first plurality of latches is configured to delay the first data bit based, at least in part, on a respective one of the first plurality of clock signals and each of the second plurality of latches is configured to delay the second data bit based, at least in part, on a respective one of the second plurality of clock signals.

18. The method of claim 16, wherein each of the first and second pluralities of latches are configured to latch responsive, at least in part, to receipt of a falling edge of a signal.

19. The method of claim 16, further comprising:

providing the first and second bits to a bus at approximately the same time.

20. The method of claim 16, wherein the first and second pluralities of clock signals comprise the same clock signals.

21. An apparatus comprising:

a clock generation circuit configured to receive an input clock signal and generate a plurality of clock signals based, at least in part, on the input clock signal; and a delay path coupled to the clock generation circuit, comprising:

a first setup and hold unit configured to receive the data signal and latch a first bit of a data signal;

a second setup and hold unit configured to receive the data signal and latch a second bit of the data signal;

a first delay unit coupled to the first setup and hold unit and configured to receive the first bit of the data signal, the first delay unit further configured to delay the first bit of the data signal using a first plurality of latches;

a second delay unit coupled to the second setup and hold unit and configured to receive the second bit of the data signal, the second delay unit further configured to delay the second bit of the data signal using a second plurality of latches; and wherein each of the first plurality of latches is configured to delay the first bit of the data signal based, at least in part, on a respective one of a first set of the plurality of clock signals and each of the second plurality of latches is configured to delay the second bit of the data signal based, at least in part, on a respective one of a second set of the plurality of clock signals, wherein the first setup and hold unit is further configured to latch the first bit responsive, at least in part, to receipt of a rising edge of the input clock signal and the second setup and hold unit is further configured to latch the second bit responsive, at least in part, to receipt of a falling edge of the input clock signal.

* * * * *